(12) United States Patent
Yu

(10) Patent No.: US 8,835,919 B2
(45) Date of Patent: Sep. 16, 2014

(54) THIN FILM TRANSISTOR SUBSTRATE HAVING METAL OXIDE AND METHOD FOR MANUFACTURING

(71) Applicant: LG Display Co., Ltd., Seoul (KR)

(72) Inventor: Sanghee Yu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 13/727,269

(22) Filed: Dec. 26, 2012

(65) Prior Publication Data

US 2014/0008645 A1    Jan. 9, 2014

(30) Foreign Application Priority Data

Jul. 6, 2012    (KR) ................... 10-2012-0074171

(51) Int. Cl.
*H01L 29/66* (2006.01)
*H01L 27/12* (2006.01)
*H01L 29/786* (2006.01)

(52) U.S. Cl.
CPC ...... *H01L 29/66742* (2013.01); *H01L 27/1248* (2013.01); *H01L 27/1225* (2013.01); *H01L 29/786* (2013.01)
USPC ........................... 257/43; 438/149

(58) Field of Classification Search
USPC ............................................ 257/43, E51.005
See application file for complete search history.

(56) References Cited

U.S. PATENT DOCUMENTS

| | | | |
|---|---|---|---|
| 6,462,800 B1* | 10/2002 | Kim et al. | 349/143 |
| 7,351,621 B2* | 4/2008 | Moon | 438/155 |
| 2004/0227865 A1* | 11/2004 | Moon | 349/47 |
| 2008/0213950 A1* | 9/2008 | Moon | 438/157 |

* cited by examiner

*Primary Examiner* — Thao P Le

(74) *Attorney, Agent, or Firm* — Fenwick & West LLP

(57) ABSTRACT

A thin film transistor substrate and a method for manufacturing the same are disclosed. The thin film transistor substrate includes a gate electrode disposed on a substrate, a gate insulating film disposed on the gate electrode, an active layer disposed on the gate insulating film and including metal oxide, a source electrode contacted with one side of the active layer and a pixel electrode contacted with the other side of the active layer; and an etch stopper interposed between the source electrode and the pixel electrode.

24 Claims, 8 Drawing Sheets

US 8,835,919 B2

THIN FILM TRANSISTOR SUBSTRATE HAVING METAL OXIDE AND METHOD FOR MANUFACTURING

CROSS REFERENCE TO RELATED APPLICATIONS

This application claims the priority benefit of Korean Patent Application No. 10-2012-0074171 filed on Jul. 6, 2012. which is incorporated herein by reference for all purposes as if fully set forth herein.

BACKGROUND

1. Field

This document relates to a thin film transistor substrate having metal oxide and a manufacturing method thereof which is capable of reducing power consumption by reducing a channel length and being applied to high-resolution models by reducing a size of an area of the thin film transistor.

2. Related Art

Recently, according to the development of multimedia, the importance of a flat panel display (FPD) is increased. Accordingly, several displays have been commercialized, such as a liquid crystal display (LCD), a plasma display panel (PDP), a field emission display (FED), an organic field light emitting device and the like.

Of these, the liquid crystal display device has an excellent visibility, small average power consumption and small heat dissipation, compared to a cathode ray tube. In addition, the field light emitting device is in the spotlight as a next-generation display device, since a response rate is high to be less than 1 ms, power consumption is low, and a viewing angle is very large by self-lighting.

Methods of driving the display device include a passive matrix method, and an active matrix using a thin film transistor. The passive matrix method is a way in that the display device is driven by forming at right angles an anode and a cathode and selecting lines, whereas the active matrix method is a way in that thin film transistors are connected to each of pixel electrodes and the display device is driven according to a voltage retained by capacity of a capacitor that is connected to a gate electrode of a thin film transistor.

It is very important to have durability and electrical reliability that can maintain a long life, as well as basic characteristics, such as mobility, leakage current and the like, of the thin film transistor. Here, an active layer of the thin film transistor is mainly formed by amorphous silicon or polycrystalline silicon. If the amorphous silicon is used, a film formation process is simpler and a manufacturing cost is low, but there is a problem in that the electrical reliability may not be ensured. In addition, if the polycrystalline silicon is used, there are problems in that it is very difficult to large-area applications due to a high temperature in the process, and uniformity is not secured according to a crystallization method.

On the other hand, if the active layer is formed as the metal oxide, high mobility can be obtained although the active layer is formed at a low temperature, and the desired properties can be easily obtained due to large change in resistance, depending on the oxygen content. Accordingly, applications to the thin film transistor have attracted great interest recently. In particular, a metal oxide semiconductor may be, for example, zinc oxide (ZnO), indium zinc oxide (InZnO), zinc tin oxide (ZnSnO), indium gallium zinc oxide (InGaZnO4) or the like.

FIG. 1 is a cross-sectional view illustrating a thin film transistor substrate including metal oxide in the prior art.

Referring to FIG. 1, a gate electrode 15 and a gate insulating film 20 are disposed on a substrate 10, and an active layer 25 consisting of metal oxide is disposed on the gate insulating film 20. An etch stopper 30 to protect the active layer 25 is disposed on the active layer 25, and a source electrode 35a and a drain electrode 35b are disposed to be contacted with the active layer 25 on the etch stopper 30 to form the thin film transistor. In addition, a passivation film 40 to protect the thin film transistor and a pixel electrode 45 contacted with the drain electrode 35b are disposed.

The thin film transistor is formed with the etch stopper 30 to prevent direct damage for the active layer 25 in a manufacturing process of the source electrode 35a and the drain electrode 35b. In this case, there is a problem in that a channel length of the active layer 25 is very long due to the etch stopper 30. Accordingly, the channel length of the active layer consisting of amorphous silicon in the prior art is longer at about 5 μm, whereas the channel length of the active layer consisting of metal oxide in the prior art is longer at about 10 μm. As a result, since power consumption of a display device is increased and an area of the thin film transistor is increased, there is a problem in that resolution is reduced.

SUMMARY

The present invention has been made in an effort to provide a method of manufacturing a thin film transistor substrate which is capable reducing power consumption by reducing a channel length and being applied to high resolution models by reducing a size of an area of a thin film transistor.

In one aspect, there is a thin film transistor substrate including a gate electrode disposed on a substrate, a gate insulating film disposed on the gate electrode, an active layer disposed on the gate insulating film and including metal oxide, a source electrode contacted with one side of the active layer substantially parallel to the substrate and a pixel electrode contacted with another side of the active layer substantially parallel to the substrate; and an etch stopper interposed between the source electrode and the pixel electrode.

In another aspect, there is a method of manufacturing a thin film transistor substrate including forming a gate electrode on a substrate, forming a gate insulating film on the gate electrode, forming an active layer including metal oxide on the gate insulating film, forming a source electrode contacted with one side of the active layer and a pixel electrode contacted with the other side of the active layer and forming an etch stopper between the source electrode and the pixel electrode.

In another aspect, there is a thin film transistor substrate including a gate electrode disposed on a substrate, a gate insulating film disposed on the gate electrode, an active layer disposed on the gate insulating film and including metal oxide, an etch stopper overlapping at least a portion of the active layer, a source electrode that at least partially overlaps the etch stopper and the active layer, and a pixel electrode at least partially overlapped by the active layer and the etch stopper.

In another aspect, there is a thin film transistor substrate including a gate electrode disposed on a substrate, a gate insulating film disposed on the gate electrode, an active layer disposed on the gate insulating film and including metal oxide, an etch stopper at least partially overlapping the active layer, a pixel electrode that at least partially overlaps the etch stopper and the active layer, and a source electrode at least partially overlapped by the active layer and the etch stopper.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
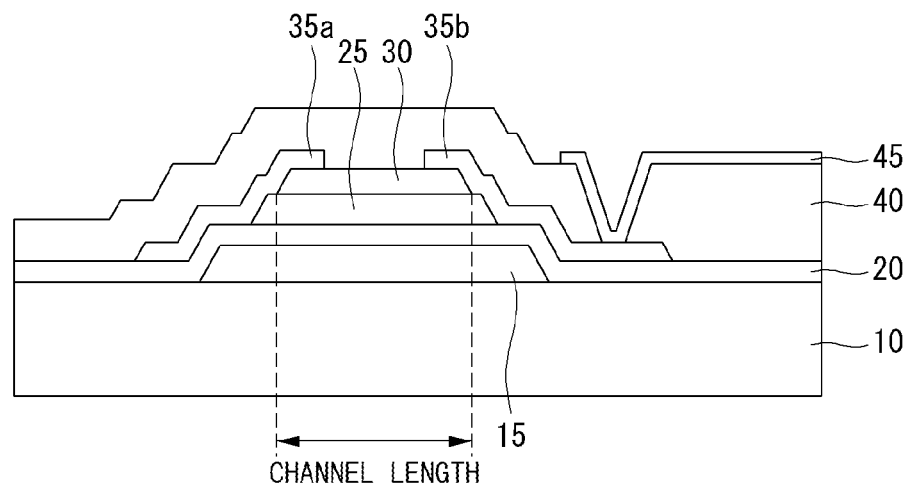
FIG. 1 is a cross-sectional view illustrating a thin film transistor substrate including metal oxide in the prior art.
Figure 2:
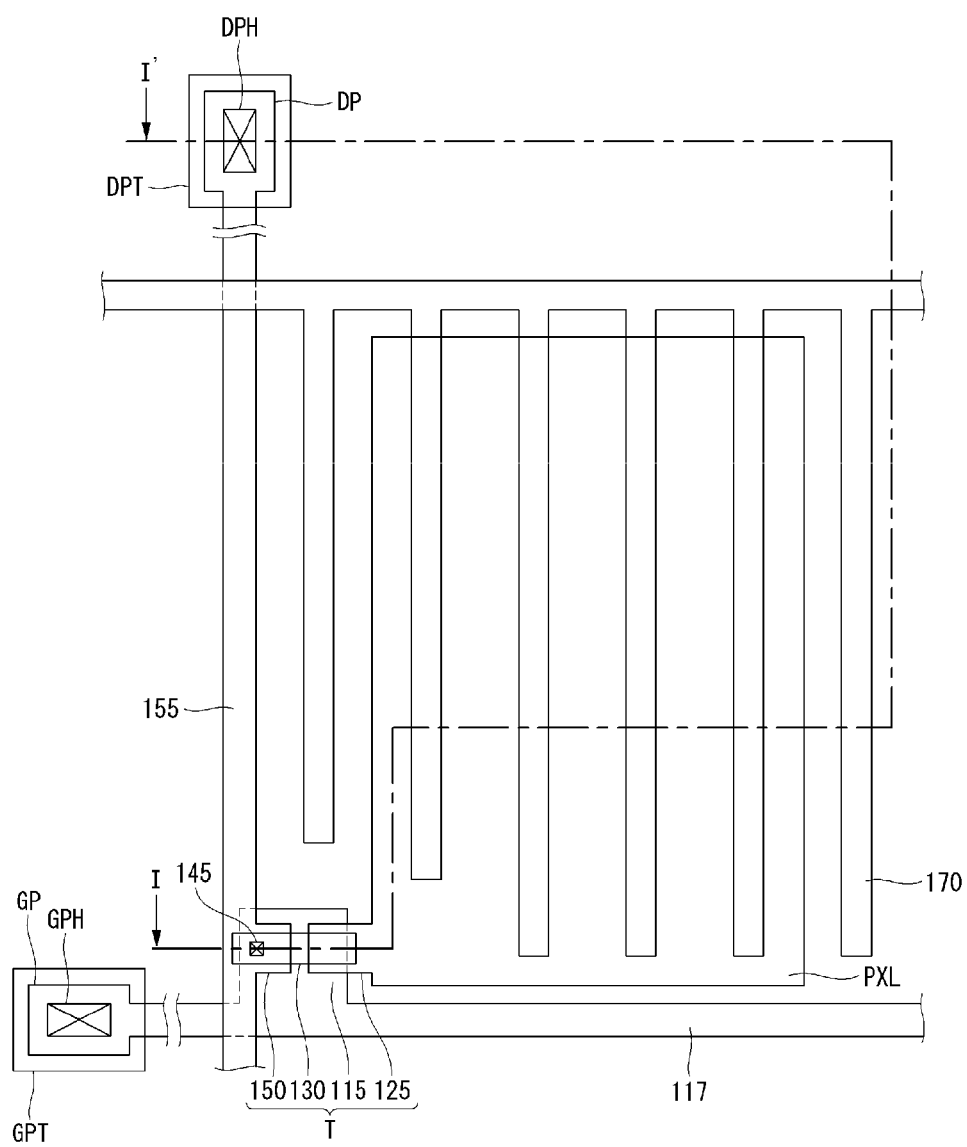
FIG. 2 is a plan view illustrating a thin film transistor substrate according to an exemplary embodiment of the present invention.
Figure 3:
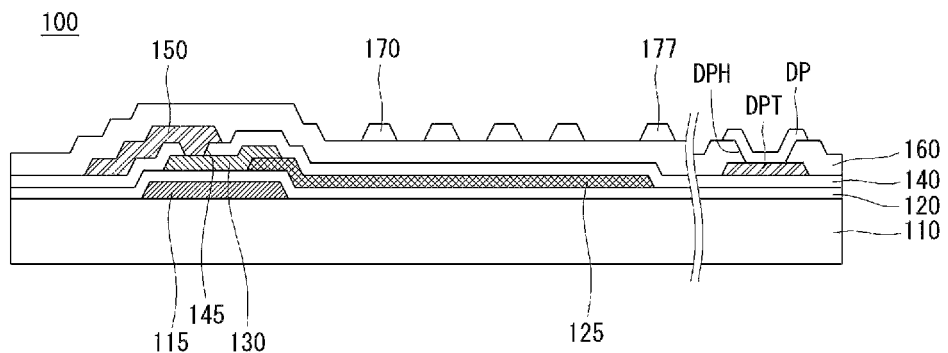
FIG. 3 is a cross-sectional view taken along a line I-I' in the thin film transistor substrate of FIG. 2.

FIG. 2 is a plan view illustrating a thin film transistor substrate according to an exemplary embodiment of the present invention, and FIG. 3 is a cross-sectional view taken along a line I-I' in the thin film transistor substrate of FIG. 2. Hereinafter, as an example of the thin film transistor substrate, the thin film transistor substrate used in a liquid crystal display of a fringe field way will be described, and in particular, one sub-pixel will be shown and described as an example.

Referring to FIGS. 2 and 3, a thin film transistor substrate 110 according to the first exemplary embodiment of the present invention includes a gate line 117 and a data line 155 that are intersected across a gate insulating film 120 on the substrate 110, and a thin film transistor (T) formed for each of intersecting portions. In addition, a pixel area is defined by the intersecting structure of the gate line 117 and the data line 155. The pixel area includes a pixel electrode 125 and a common electrode 170, which are formed across a passivation film 160 and an etch stopper 140 to form a fringe field. The pixel electrode 125 has a roughly rectangular shape corresponding (for example, the shape of a plate) to the pixel area, and the common electrode 170 is formed in a shape having a plurality of parallel bands.

The common electrode 170 is connected to a common line 177 aligned with the gate line 117. The common electrode 170 is supplied with a reference voltage (or common voltage) for LED driving through the common line 177.

The thin film transistor (T) allows pixel signals of the data line 155 to be charged and maintained to the pixel electrode 125 in response to gate signals of the gate line 117. To this purpose, the thin film transistor (T) includes a gate electrode 115 branched from the gate line 117, a source electrode 150 branched from the data line 155, the pixel electrode 125 opposed to the source electrode 150, and an active layer 130 overlapped with the gate electrode 115 on a gate insulating film 120 and forming a channel between the source electrode 150 and the pixel electrode 125. In addition, thin film transistor (T) may further include an ohmic contact layer for ohmic contact between the active layer 130 and the source electrode 150, and between the active layer 130 and the pixel electrode 125.

In particular, if the active layer 130 is formed as metal oxide, the thin film transistor substrate for large area in charging capacity is advantageous due to high charge mobility characteristics. However, metal oxide semiconductor materials further includes an etch stopper 140 on an upper surface for protection from etchant in order to ensure stability of elements. Specifically, the etch stopper 140 is formed to prevent the active layer 130 from being etched by the etchant introduced in forming the source electrode 150 by an etching process. In this embodiment of the present invention, the etch stopper 140 is formed on a front surface of the substrate 110, and a contact hole 145 is formed to expose only a portion of an area of the active layer 130.

One end of the gate line 117 is provided with a gate pad (GP) to receive a gate signal from the outside. The gate pad (GP) is in contacted with a gate pad terminal (GPT) through a gate pad contact hole (GPH) which is passed through the gate insulating film 120, the etch stopper 140 and the passivation film 160. On the other hand, one end of the data line 155 is provided with a data pad (DP) for receiving pixel signals from the outside. The data pad (DP) is in contacted with a data pad terminal (DPT) through a data pad contact hole (DPH), which is passed through the passivation film 160.

In this embodiment of the present invention, the pixel electrode 125 is in contacted with the active layer 130 over the gate insulating film 120, such that it functions as a pixel electrode and a drain electrode at the same time. On the other hand, the common electrode 170 is formed to be overlapped with the pixel electrode 125 across the etch stopper 140 covering the pixel electrode 125 and the passivation film 160. Thus, an electric field is formed between the pixel electrode 125 and the common electrode, such that liquid crystal molecules arranged in a horizontal direction between the thin film transistor substrate and a color filter substrate are rotated by dielectric anisotropy. In addition, light transmissivity is changed depending on degrees of rotation of the liquid crystal molecules to implement gradation.

Hereinafter, the method of manufacturing the thin film transistor substrate of FIGS. 2 and 3 as described above will be described in detail. Herein, the same reference numerals denote the same elements as in the descriptions for the method of manufacturing the thin film transistor substrate in FIGS. 2 and 3 described above, and thus the detailed descriptions of the same elements will be omitted. FIGS. 4a to 4d are cross-sectional views illustrating a manufacturing process of a thin film transistor substrate according to an exemplary embodiment of the present invention, and FIG. 5 is a plan view illustrating the thin film transistor substrate of FIG. 3.

Figure 4A:
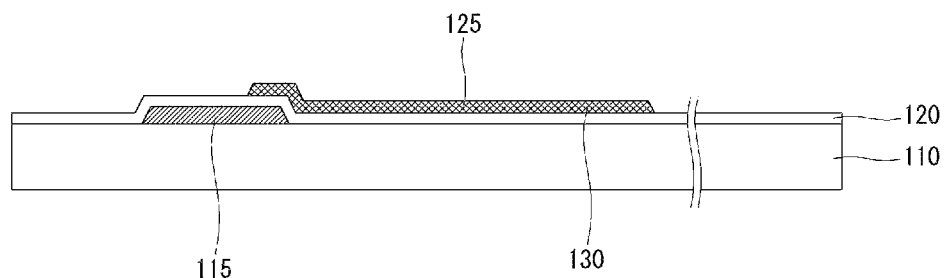
FIGS. 4a to 4d are cross-sectional views illustrating a manufacturing process of a thin film transistor substrate according to an exemplary embodiment of the present invention.
Figure 5:
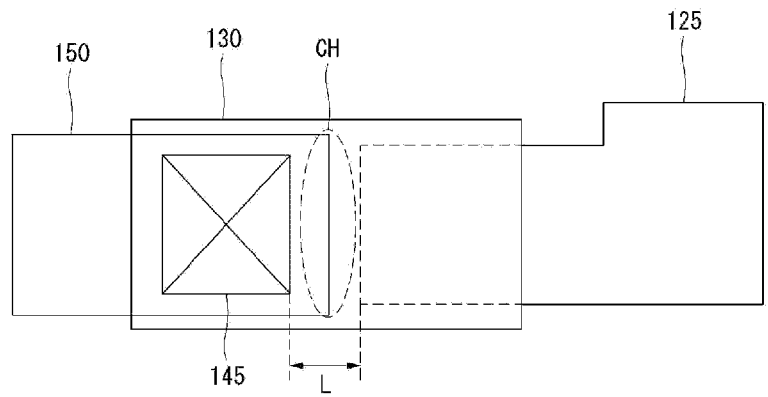
FIG. 5 is a plan view illustrating the thin film transistor substrate of FIG. 3.

Referring to FIG. 4a, a gate metal is deposited on a transparent substrate 110. The gate metal includes one selected from a group consisting of molybdenum (Mo), aluminum (Al), chromium (Cr), gold (Au), titanium (Ti), nickel (Ni) and copper (Cu), or low-resistance metallic materials such as alloys thereof The gate electrode 115 is formed by patterning the gate metal using a first mask. Although not shown in the drawings, the gate electrode 115 is formed while forming the gate line.

Subsequently, the gate insulating film 120 is formed on the substrate 110 including the gate electrode 115. The gate insulating film 120 may use silicon oxide (SiOx) or silicon nitride (SiNx) and may be formed as multi-layers thereof Since then, materials of the pixel electrode are deposited on the gate insulating film 120. The pixel electrode material may include indium tin oxide (ITO) or indium zinc oxide (IZO). The pixel electrode 125 is formed by patterning the pixel electrode material using a second mask. The pixel electrode 125 is formed in a shape of plate on the pixel region, and also formed on a portion region corresponding to the gate electrode 115.

Figure 4B:
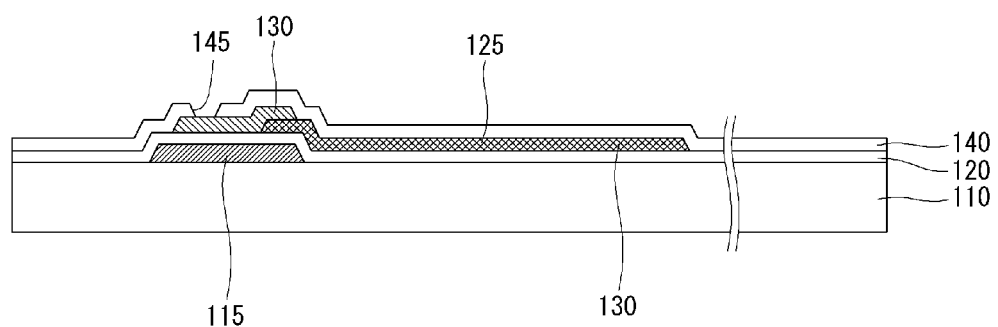

Next, referring to FIG. 4b, metal oxide is deposited on the substrate 110 formed with the pixel electrode 125 and patterned by using a third mask to form the active layer 130 overlapped with the gate electrode 115. Here, the active layer 130 may be formed by the metal oxide, and the metal oxide may be, for example, zinc oxide (ZnO), indium zinc oxide (InZnO), zinc tin oxide (ZnSnO), indium gallium zinc oxide (InGaZnO$_4$) or the like. In this case, the active layer 130 is overlapped with the gate electrode 115 and formed on the pixel electrode 125 to be in contacted with a portion of the pixel electrode 125.

Subsequently, the etch stopper 140 is formed on top of the active layer 130. The etch stopper 140 may be formed by silicon oxide (SiOx) or silicon nitride (SiNx). In addition, a contact hole 145 is formed to expose an upper portion of one side of the active layer 130 by etching a portion of the etch stopper 140 using a fourth mask.

Figure 4C:
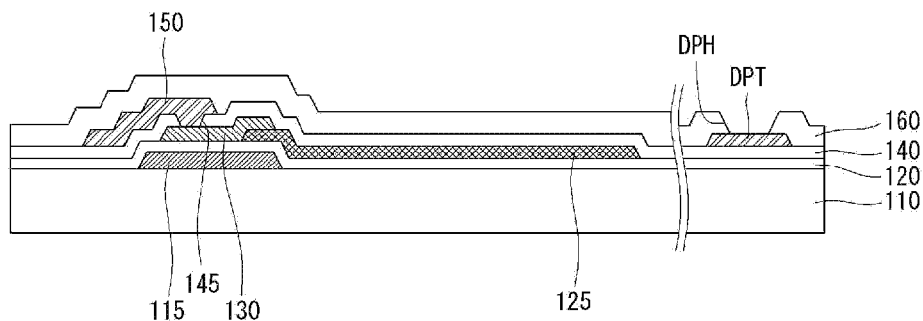

Next, referring to FIG. 4c, a source metal is deposited on the substrate 110 formed with the etch stopper 140, and the substrate 110 is patterned using a fifth mask, such that the source electrode 150 and the data pad terminal (DPT) are formed. The source metal includes one selected from a group consisting of molybdenum (Mo), aluminum (Al), chromium (Cr), gold (Au), titanium (Ti), nickel (Ni) and copper (Cu), or low-resistance metallic materials such as alloys thereof. The source electrode 150 is in contacted with an upper of one side of the active layer 130 through the contact hole 145 of the etch stopper 140. Although not shown in the drawings, the source electrode 150 and the data line are formed at the same time.

Accordingly, the thin film transistor (T) is formed to include the gate electrode 115, the active layer 130, the pixel electrode 125 and the source electrode 150. The pixel electrode 125 functions as the drain electrode and the pixel electrode at the same time.

Next, silicon oxide (SiOx) or silicon nitride (SiNx) is deposited on substrate 110 formed with the source electrode 150 and the data pad terminal (DPT) to form the passivation film 160. In addition, a data pad contact hole (GPH) is formed to expose the data pad terminal (DPT) by etching a portion of the passivation film 160 using a sixth mask.

Figure 4D:
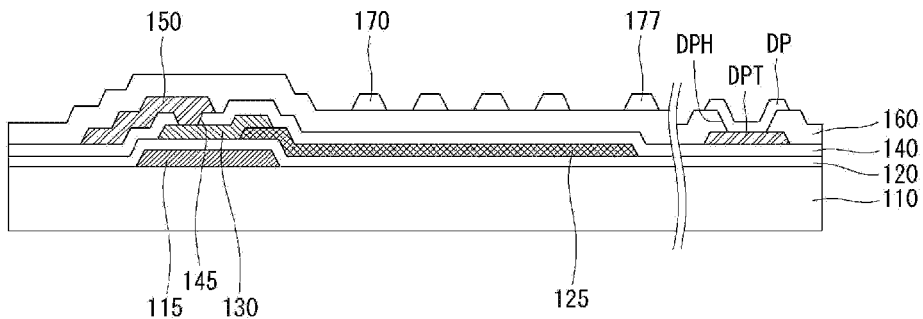

Subsequently, referring to FIG. 4d, indium tin oxide (ITO) or indium zinc oxide (IZO) is deposited in a front of the substrate 110 and the substrate 110 is patterned using a seventh 7masks, such that a common electrode 170, a common line 177 and a data pad (DP) are formed. The common electrode 170 is formed to be corresponded to the pixel electrode 125 in the pixel region, and the electrodes with several bar shapes parallel to each other have a shape arranged at regular intervals.

Referring to FIG. 5, in the thin film transistor as manufactured above according to the embodiment of the present invention, the source electrode and the pixel electrode contacted with the active layer are formed on different layers, such that the channel length of the active layer can be reduced. In addition, a channel (CH) of the active layer 130 is formed between the pixel electrode 125 directly contacted with a lower portion of one side of the active layer 130 and the source electrode 150 contacted with an upper portion of the other side of the active layer 130 through the contact hole 145. In this case, since the length (L) of the channel (CH) is corresponded to a distance from a contact part of the source electrode 150 to a contact part of the pixel electrode 125, the length (L) of the channel (CH) can be reduced greatly.

In one embodiment, the extent to which the source and pixel electrodes overlap the active layer 130 is large enough such that a length (L) of the channel (CH) is less than a majority of the length of the active layer in total. For example, the length (L) of the channel (CH) can be less than the extent (distance) of the overlap of the source electrode over (or under) the active layer 130. Similarly, the length (L) of the channel (CH) can be less than the extent (distance) of the overlap of the pixel electrode over (or under) the active layer 130.

In addition, since the source electrode 150 and the pixel electrode 125 can be formed on the different layers across active layer 130, the active layer 130 can be reduced in overall size. Therefore, it has an advantage in that sizes of sub-pixels are reduced depending on reduction of the areas of the thin film transistor, thereby being applied to high-resolution models.

In addition, the source electrode 150 and the pixel electrode 125 can be formed on different layers across active layer 130, and the thin film transistor can be manufactured using the same 7 sheets of masks as the conventional thin film transistor that is formed on the same layers with the source/drain electrodes. Accordingly, there is an advantage in that the length of the channel of the active layer can be reduced, without increasing the manufacturing cost and processing time.

Figure 6:
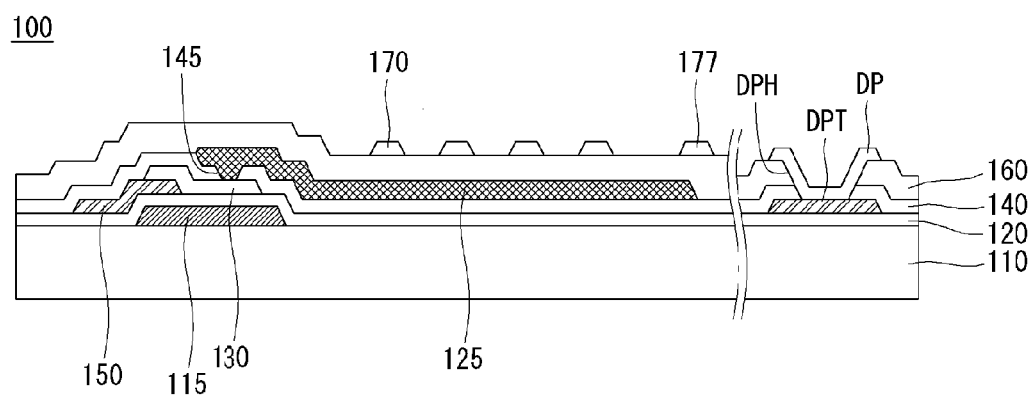
FIG. 6 is a cross-sectional view illustrating a thin film transistor substrate according to an exemplary embodiment of the present invention.

In addition, according to the embodiment of the present invention, the pixel electrode 125 is formed which consists of transparent conductive materials, for example, metal oxide series such as ITO and functions of the pixel electrode 125 and the drain electrode are performed simultaneously. In particular, if the pixel electrode 125 is in directly contacted with the active layer 130, metal oxides of the active layer 130 and the pixel electrode 125 are consisted of oxide-like series. Accordingly, there is an advantage in that electrical characteristics can be excellent since an ingress barrier of interface is lower, without having ohmic layers On the other hand, the thin film transistor substrate can be formed to have different structures from these of FIGS. 2 to 5 as described above. Hereinafter, the same reference numerals denote the same elements as the structure shown in FIG. 3, and thus the detailed descriptions of the same elements will be omitted. FIG. 6 is a cross-sectional view illustrating a thin film transistor substrate according to an exemplary embodiment of the present invention.

Referring to FIG. 6, the gate electrode 115 is disposed on the substrate 110, and the gate insulating film 120 is disposed on the gate electrode 115. The source electrode 150 and the data pad terminal (DPT) are disposed on the gate insulating film 120 and contacted with one side of the source electrode 150. In addition, the active layer 130 is formed which includes metal oxide over the gate insulating film 120. The etch stopper 140 is disposed on the active layer 130 and on the data pad terminal (DPT), and the pixel electrode 125 is disposed on the etch stopper 140. The pixel electrode 125 is in contacted with an other side of the active layer 130 through a via hole 145 formed on the etch stopper 140.

In addition, the passivation film 160 is formed on the substrate 110 formed with the pixel electrode 125, and the common electrode 170, the common line 177 and the data pad (DP) are disposed on the passivation film 170. The common electrode 170 is formed to be opposed to the above-mentioned pixel electrode 125, and the data pad (DP) is connected to the data pad terminal (DPT) through the data pad contact hole (DPH) to expose the data pad terminal (DPT) by passing through the passivation film 160 and the etch stopper 140

In the thin film transistor substrate 100 of FIG. 6, the source electrode 150 and the pixel electrode 125 are disposed differently, unlike the above-mentioned structure of FIG. 3. In other words, the source electrode 150 and the pixel electrode 125 are disposed on an upper portion and on a lower portion across the active layer 130, respectively, in the structure of FIG. 3. In contrast, the source electrode 150 and the pixel electrode 125 may be disposed on a lower portion and on the upper portion across the active layer 130, respectively, in the structure of FIG. 6.

Figure 7:
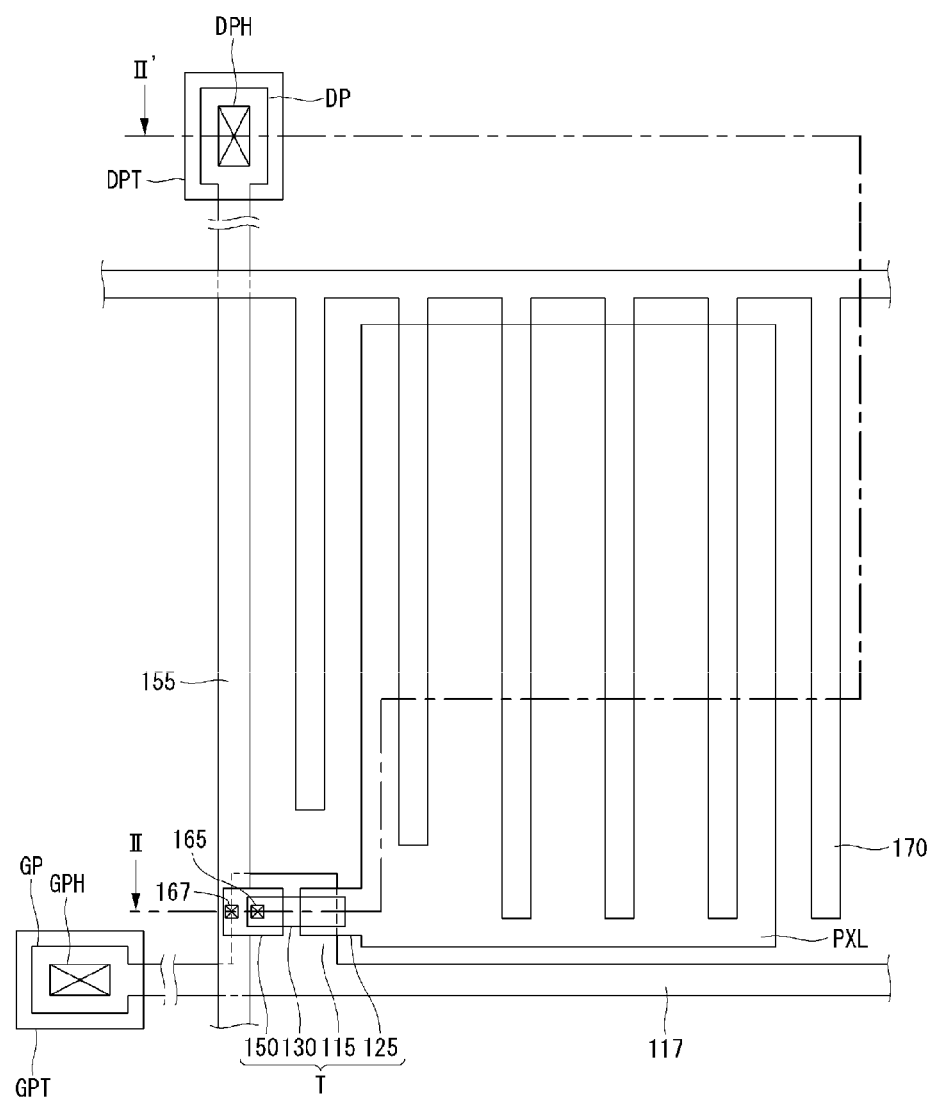
FIG. 7 is a plan view illustrating a thin film transistor substrate according to another exemplary embodiment of the present invention.
Figure 8:
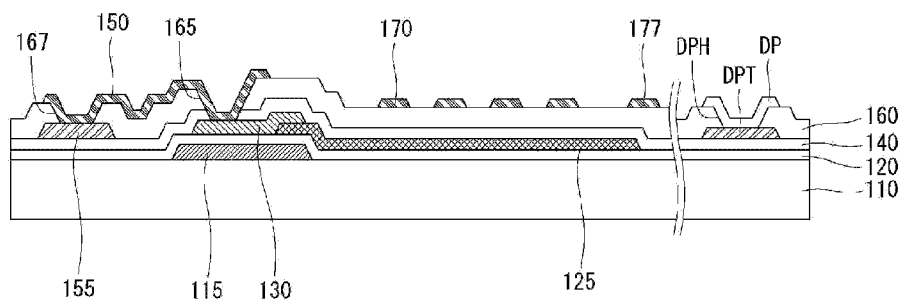
FIG. 8 is a cross-sectional view taken along a line II-II' in the thin film transistor substrate of FIG. 6.

FIG. 7 is a plan view illustrating a thin film transistor substrate according to another exemplary embodiment of the present invention, and FIG. 8 is a cross-sectional view taken along a line II-II' in the thin film transistor substrate of FIG. 6.

Hereinafter, the same reference numerals denote the elements that act the same as the foregoing embodiments, and thus it will be easy to understand the present invention.

Referring to FIGS. 7 and 8, according to another embodiment of the present invention, a thin film transistor substrate 200 includes a gate line 117 and a data line 155 intersected across the gate insulating film 120 on the substrate 110, and a thin film transistor (T) formed on each of intersected portions. The pixel region is provided with the pixel electrode 125 and the common electrode 170, which are formed across the passivation film 160 and the etch stopper 140. The common electrode 170 is connected to a common line 177 aligned with the gate line 117.

The thin film transistor (T) includes a gate electrode 115 branched from the gate line 117, a source electrode 150 connected to the data line 155, a pixel electrode 125 opposed to the source electrode 150, and an active layer 130 overlapped with the gate electrode 115 on a gate insulating film 120 and forming a channel between the source electrode 150 and the pixel electrode 125. The etch stopper 140 is formed on the active layer 130, and the etch stopper 140 includes a first via hole 165 and a second via hole 167 to expose only a portion of region of the active layer 130.

One end of the gate line 117 is provided with a gate pad (GP) to receive a gate signal from the outside. The gate pad (GP) is in contacted with a gate pad terminal (GPT) through a gate pad contact hole (GPH) which is passed through the gate insulating film 120, the etch stopper 140 and the passivation film 160. Meanwhile, one end of the data line 155 is provided with a data pad (DP) for receiving pixel signals from the outside. The data pad (DP) is in contacted with a data pad terminal (DPT) through a data pad contact hole (DPH) which is passed through the passivation film 160.

The pixel electrode 125 according to the embodiment of the present invention is in contacted with the active layer 130 over the gate insulating film 120, such that it functions as a pixel electrode and a drain electrode at the same time pixel electrode. On the other hand, the common electrode 170 is formed to be overlapped with the pixel electrode 125 across the etch stopper 140 covering the pixel electrode 125 and the passivation film 160.

Hereinafter, the method of manufacturing the thin film transistor substrate of FIGS. 7 and 8 as described above will be described in detail. FIGS. 9a to 9d are cross-sectional views illustrating a manufacturing process of a thin film transistor substrate according to an exemplary embodiment of the present invention.

Figure 9A:
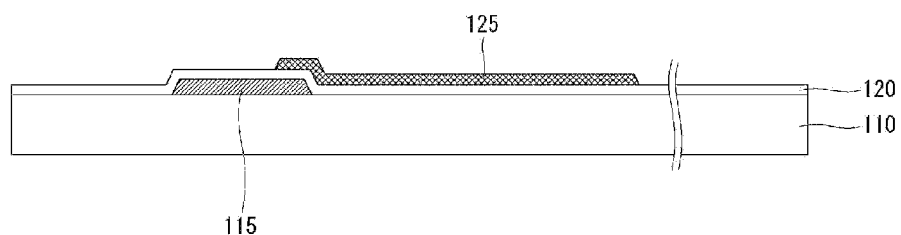
FIGS. 9a to 9d are cross-sectional views illustrating a manufacturing process of a thin film transistor substrate according to an exemplary embodiment of the present invention.

Referring to FIG. 9a, a gate metal is deposited on a transparent substrate 110. The gate metal includes one selected from a group consisting of molybdenum (Mo), aluminum (Al), chromium (Cr), gold (Au), titanium (Ti), nickel (Ni) and copper (Cu), or low-resistance metallic materials such as alloys thereof The gate electrode 115 is formed by patterning the gate metal using a first mask. Although not shown in the drawings, the gate electrode 115 is formed while the gate line is formed.

Subsequently, the gate insulating film 120 is formed on the substrate 110 including the gate electrode 115. The gate insulating film 120 may use silicon oxide (SiOx) or silicon nitride (SiNx) and may be formed as multi-layers thereof Since then, a pixel electrode material is deposited on the gate insulating film 120. The pixel electrode material may include indium tin oxide (ITO) or indium zinc oxide (IZO). The pixel electrode 125 is formed by patterning the pixel electrode material using a second mask. The pixel electrode 125 is formed in a shape of plate in the pixel region, and also formed in a portion region corresponding to the gate electrode 115.

Figure 9B:
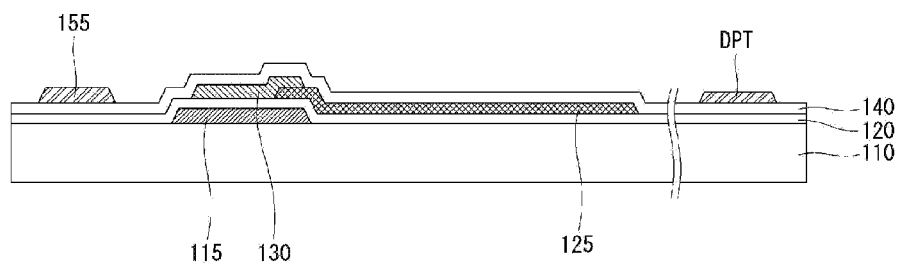

Next, referring to FIG. 9b, metal oxide is deposited on the substrate 110 formed with the pixel electrode 125 and patterned by using a third mask to form the active layer 130 overlapped with the gate electrode 115. Here, the active layer 130 may be formed by the metal oxide, and the metal oxide may be, for example, zinc oxide (ZnO), indium zinc oxide (InZnO), zinc tin oxide (ZnSnO), indium gallium zinc oxide (InGaZnO$_4$) or the like. In this case, the active layer 130 is overlapped with the gate electrode 115 and formed on the pixel electrode 125 to be in contacted with a portion of the pixel electrode 125.

Subsequently, an etch stopper 140 is formed in a front of the substrate 110 formed with the active layer 130. The etch stopper 140 may be formed by silicon oxide (SiOx) or silicon nitride (SiNx). Next, metal oxide is deposited on the substrate 110 formed with the etch stopper 140, and the substrate 110 is patterned using a fourth mask to form the data line 155 and the data pad terminal (DPT). The data metal includes one selected from a group consisting of molybdenum (Mo), aluminum (Al), chromium (Cr), gold (Au), titanium (Ti), nickel (Ni) and copper (Cu), or low-resistance metallic materials such as alloys thereof.

Figure 9C:
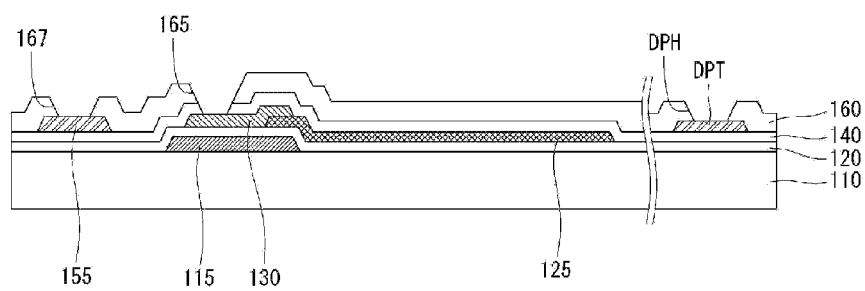

Next, referring to FIG. 9c, silicon oxide (SiOx) or silicon nitride (SiNx) are deposited on the substrate 110 formed with the data line 155 and the data pad terminal (DPT) to form the passivation film 160. In addition, a portion of the etch stopper 140 and the passivation film 160 is etched using a fifth mask, such that a first via hole 165 to expose an upper of an other side of the active layer 130 is formed. At the same time, the passivation film 160 is etched, such that a second via hole 167 to expose the data line 155 is formed and data pad contact hole (DPH) to expose the data pad terminal (DPT) is formed.

Figure 9D:
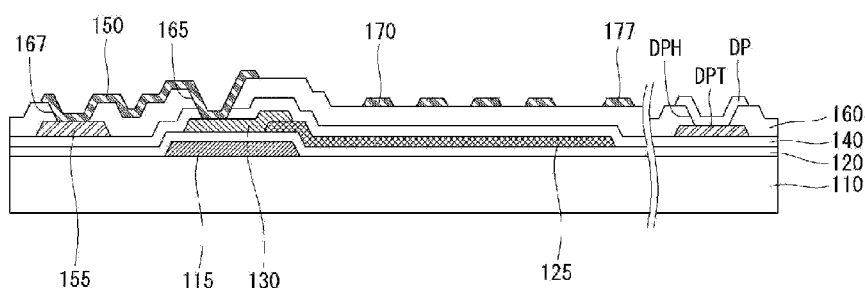

Subsequently, referring to FIG. 9d, indium tin oxide (ITO) or indium zinc oxide (IZO) is deposited in a front of the substrate 110 and the substrate 110 is patterned using a sixth mask, such that a common electrode 170, a common line 177, a data pad (DP) and source electrode 150 are formed. The common electrode 170 is formed to be corresponded to the pixel electrode 125 in the pixel region, and it has a shape arranged at regular intervals with electrodes with several bars parallel to each other. The source electrode 150 is in contacted with the active layer 130 and the data line 155, respectively, through a first hole 165 to expose an other side of the active layer 130 and a second hole 167 to expose the data line 155. Accordingly, the source electrode 150 is connected to the active layer 130 and the data line 155 to transmit data signals to the active layer 130.

According to another embodiment of the present invention, of course, the thin film transistor substrate of FIGS. 8 and 9 manufactured as described above has the same effect as the above-mentioned embodiment of FIGS. 3 and 4, however the thin film transistor substrate of FIGS. 8 and 9 can be manufactured using a total of 6 sheets reduced by one sheet as compared to the embodiments of FIGS. 3 and 4. Specifically, only contact hole mask is used for the embodiments of FIGS. 8 and 9, whereas two contact hole masks were used in the embodiments of FIGS. 3 and 4. Accordingly, there is an advantage in that the manufacturing cost and processing time of the thin film transistor substrate can be reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film transistor substrate, comprising:
   a gate electrode disposed on a substrate;
   a gate insulating film disposed on the gate electrode;
   an active layer disposed on the gate insulating film and including metal oxide;
   a source electrode contacted with one side of the active layer substantially parallel to the substrate and a pixel electrode contacted with another side of the active layer substantially parallel to the substrate; and
   an etch stopper interposed between the source electrode and the pixel electrode.

2. The thin film transistor substrate of claim 1, wherein the pixel electrode is directly contacted with a lower portion of one side of the active layer.

3. The thin film transistor substrate of claim 2, wherein the pixel electrode is fully covered by the etch stopper.

4. The thin film transistor substrate of claim 1, wherein the source electrode is directly contacted with an upper portion of one side of the active layer through a contact hole in the etc stopper.

5. The thin film transistor substrate of claim 1, further comprising:
   a data line disposed on the etch stopper and arranged to be adjacent to the active layer;
   a passivation film disposed on the data line and the etch stopper; and
   a common electrode disposed on the passivation film.

6. The thin film transistor substrate of claim 5, wherein the passivation film includes a first via hole to expose an upper portion of the one side of the active layer and a second via hole to expose the data line.

7. The thin film transistor substrate of claim 6, wherein the source electrode is contacted with the upper portion of the one side of the active layer and the data line through the first via hole and the second via hole.

8. The thin film transistor substrate of claim 7, wherein the source electrode includes the same materials as the common electrode.

9. The thin film transistor substrate of claim 1, wherein the source electrode is directly contacted with a lower portion of one side of the active layer.

10. The thin film transistor substrate of claim 9, wherein the pixel electrode is disposed on the etch stopper and contacted with the active layer through a contact hole formed on the etch stopper.

11. The thin film transistor substrate of claim 10, wherein the source electrode is fully covered by the etch stopper.

12. A method of manufacturing a thin film transistor substrate, comprising:
   forming a gate electrode on a substrate;
   forming a gate insulating film on the gate electrode;
   forming an active layer including metal oxide on the gate insulating film;
   forming a source electrode contacted with one side of the active layer and a pixel electrode contacted with an other side of the active layer; and
   forming an etch stopper between the source electrode and the pixel electrode.

13. The method of claim 12, further comprising:
   forming a passivation film on the substrate formed with the source electrode; and
   forming a common electrode on the passivation film.

14. A method of manufacturing a thin film transistor substrate, comprising:
   forming a gate electrode on a substrate;
   forming a gate insulating film on the gate electrode;
   forming a pixel electrode on the gate insulating film;
   forming an active layer including metal oxide on the gate insulating film to be contacted with one side of the pixel electrode;
   forming an etch stopper on the active layer and the pixel electrode;
   forming a data line on the etch stopper to be adjacent to the active layer;
   forming a passivation film on the substrate on which the data line is formed, wherein a first via hole to expose the active layer and a second via hole to expose the data line are formed; and
   forming a common electrode and a source electrode on the passivation film, wherein the source electrode is formed to be contacted with the active layer and the data line through the first via hole and the second via hole.

15. A thin film transistor substrate, comprising:
   a gate electrode disposed on a substrate;
   a gate insulating film disposed on the gate electrode;
   an active layer disposed on the gate insulating film and including metal oxide;
   an etch stopper overlapping at least a portion of the active layer;
   a source electrode that at least partially overlaps the etch stopper and the active layer; and
   a pixel electrode at least partially overlapped by the active layer and the etch stopper.

16. The thin film transistor substrate of claim 15 wherein:
   the etch stopper overlaps the active layer except for a hole through the etch stopper; and
   the source electrode contacts the active layer through the hole.

17. The thin film transistor substrate of claim 15, further comprising:
   a passivation film disposed on the source electrode and the etch stopper; and a common electrode disposed on the passivation film in a region adjacent to the active layer.

18. The thin film transistor substrate of claim 15 wherein, in the region adjacent to the active layer, the pixel electrode overlaps the gate insulating film and is overlapped by the etch stopper, the passivation film, and the common electrode.

19. The thin film transistor substrate of claim 15, further comprising:
 a passivation film disposed on the etch stopper, and wherein the source electrode at least partially overlaps the passivation film; and
 a common electrode disposed on the passivation film in a region adjacent to the active layer.

20. The thin film transistor substrate of claim 19 wherein, in the region adjacent to the active layer, the pixel electrode overlaps the gate insulating film and is overlapped by the etch stopper, the passivation film, and the common electrode.

21. The thin film transistor substrate of claim 15 wherein
 the source electrode contacts the active layer a first distance along a length of the active area;
 the pixel electrode contacts the active layer a second distance along the length; and
 wherein a channel region length along the length of the thin film transistor substrate is less than the first and second distances.

22. A thin film transistor substrate, comprising:
 a gate electrode disposed on a substrate;
 a gate insulating film disposed on the gate electrode;
 an active layer disposed on the gate insulating film and including metal oxide;
 an etch stopper at least partially overlapping the active layer;
 a pixel electrode that at least partially overlaps the etch stopper and the active layer; and
 a source electrode at least partially overlapped by the active layer and the etch stopper.

23. The thin film transistor substrate of claim 22 wherein
 the etch stopper overlaps the active layer except for a via hole through the etch stopper; and wherein
 the pixel electrode contacts the active layer through the via hole.

24. The thin film transistor substrate of claim 22 wherein
 the source electrode contacts the active layer a first distance along a width of the active area;
 the pixel electrode contacts the active layer a second distance along the width; and
 wherein a channel region width along the width of the thin film transistor substrate is less than the first and second distances.

* * * * *